United States Patent

[11] 3,621,347

[72] Inventor Johannes A. Van Nielen
Emmasingel, Eindhoven, Netherlands

[21] Appl. No. 831,397
[22] Filed June 9, 1969
[45] Patented Nov. 16, 1971
[73] Assignee U.S. Philips Corporation
New York, N.Y.
[32] Priority June 14, 1968
[33] Netherlands
[31] 6808352

[54] SEMICONDUCTOR DEVICE COMPRISING A FIELD EFFECT TRANSISTOR HAVING AN INSULATED GATE ELECTRODE AND CIRCUIT ARRANGEMENT COMPRISING SUCH A SEMICONDUCTOR DEVICE
17 Claims, 7 Drawing Figs.

[52] U.S. Cl. ........ 317/235 R, 317/235 B, 317/235 G, 317/275 UA, 307/304

[51] Int. Cl. ........ H01l 11/14
[50] Field of Search ........ 317/235 (21.1), 235 (22.2); 307/205, 279, 304; 330/35

[56] References Cited

UNITED STATES PATENTS

| | | | |
|---|---|---|---|
| 3,268,827 | 8/1966 | Carlson et al. | 317/235 |
| 3,313,959 | 4/1967 | Dill | 317/235 |
| 3,315,096 | 4/1967 | Carlson et al. | 317/235 |
| 3,387,286 | 6/1968 | Dennard | 317/235 |
| 3,462,657 | 8/1969 | Brown | 317/235 |
| 3,492,511 | 1/1970 | Crawford | 317/235 |

FOREIGN PATENTS

| | | | |
|---|---|---|---|
| 11,982 | 5/1968 | Japan | 317/235 |
| 1,526,386 | 4/1968 | France | 317/235 |
| 1,541,432 | 8/1968 | France | 317/235 |

*Primary Examiner*—Jerry D. Craig
*Attorney*—Frank R. Trifari

ABSTRACT: An insulated gate field-effect transistor having a decoupling capacitor between the gate and substrate.

INVENTOR.
JOHANNES A. VAN NIELEN
BY
AGENT

INVENTOR.
JOHANNES A. VAN NIELEN
BY
AGENT

INVENTOR.
JOHANNES A. VAN NIELEN
BY
[signature]
AGENT

INVENTOR.
JOHANNES A. VAN NIELEN
BY
[signature]
AGENT

SEMICONDUCTOR DEVICE COMPRISING A FIELD EFFECT TRANSISTOR HAVING AN INSULATED GATE ELECTRODE AND CIRCUIT ARRANGEMENT COMPRISING SUCH A SEMICONDUCTOR DEVICE

The invention relates to a semiconductor device having a semiconductor body which is covered at least partly by an insulating layer, comprising a field effect transistor of the type having an insulated gate electrode which consists of a substrate region of one conductivity type in which are situated electrode regions of the opposite conductivity type adjoining the surface and associated with the source and drain electrodes, a gate electrode being provided between the electrode regions on the insulating layer.

The invention furthermore relates to a circuit arrangement comprising such a semiconductor device.

Semiconductor devices of the type described are frequently used particularly for amplifying electric signals. In the circuit arrangements used the source electrode usually is common for the input circuit and for the output circuit, while the substrate region is connected electrically to the source electrode.

It is known that particularly at high frequencies, other circuit arrangements in which the insulated gate electrode is common for the input circuit and the output circuit are preferred in circumstances, inter alia in connection with a more favorable noise adaptation. The signal to be amplified is supplied to the source electrode and the amplified signal is derived from the drain electrode. However, the field effect transistor described is hardly ever used in such a circuit arrangement since the capacity of the P-N junction between the drain electrode and the substrate region occurs as a feedback capacity which is usually undesirable.

It is the object of the invention to provide a new construction of the semiconductor device described, in which the electric properties of the device are considerably improved when used in a number of circuit arrangements.

The invention is based inter alia on the recognition of the fact that important advantages with respect to circuit technology can be obtained by connecting the gate electrode for alternating signals with the substrate region.

A semiconductor device of the type mentioned in the preamble is therefore characterized according to the invention in that the gate electrode is capacitively connected to the substrate region via a decoupling capacity which is larger than the capacity of the P-N junction between the drain electrode region and the substrate region.

The device according to the invention inter alia has the important advantage that without the above-mentioned drawbacks it can advantageously be used in an amplifier circuit in which the insulated gate electrode is common for the input circuit and the output circuit and in which a signal to be amplified is supplied to the source electrode, while the amplified signal is derived from the drain electrode. Since the device according to the invention the substrate region is capacitively connected to the gate electrode for alternating signals via the decoupling capacity, reaction from the output to the input in the above circuit can occur substantially only via the current channel along the surface between the source electrode and the drain electrode. In general, this remaining reaction will be small an in many cases permissible as a result of the occurrence of pinch-off at the drain electrode.

The invention is of particular advantage in those circuit arrangements, in which the field effect transistor is operated in the enchancement mode, in which a voltage is applied between the substrate region and the insulated gate electrode, so that the surface region situated between the gate electrode, the channel region, of the substrate region is enhanced with charge carriers of the opposite conductivity type. Actually, in these circuit arrangements a direct conductive connection of the insulated gate electrode with the substrate region is not possible, in contrast with the case in which the transistor is operated in the depletion mode, since as a result of this, the P-N junction between the source electrode and the surface region would be polarized in the forward direction in such manner that injection of minority charge carriers occurs in the underlying substrate region.

In order to obtain a considerably decrease of the feedback coupling, it will be desirable to make the decoupling capacity large with respect to the capacity between the drain electrode and the substrate region, preferably at least ten times as large. For the same reasons the series resistance of the current path between the drain electrode and the gate electrode via the semiconductor body will be kept low. For that purpose, according to an important preferred embodiment the semiconductor body consists of a semiconductor material of one conductivity type having a resistivity of maximally 1 Ohm.cm., in which the electrode regions of the opposite conductivity type are provided.

The above-mentioned series resistance can very simply be realized by using an epitaxial structure having a substrate of a low resistivity. A further preferred embodiment of the device according to the invention is therefore characterized in that the semiconductor body consists of a substrate of one conductivity type on which an epitaxial layer of one conductivity having a higher resistivity than the substrate is provided which forms the substrate region. The resistivity of the substrate is preferably chosen to be maximally equal to 0.1 Ohm.cm., preferably has a resistivity which lies between approximately 0.5 Ohm. cm. and approximately 5 Ohm.cm. The series resistance of the current path between the drain electrode and the gate electrode will mainly be determined by the resistivity of the low-ohmic substrate.

In addition to the above-mentioned decreased feedback coupling, a further advantage of the device according to the invention is an increase of the steepness, that is to say, the extend to which the drain current varies with the signal voltage on the insulated gate electrode. This increase of the steepness is obtained in that for alternating signals the gate electrode and the substrate region are substantially short-circuited so that the current channel at the surface between the source and drain electrode is influenced both by the field induced by the insulated gate electrode and by the width of the depletion layer varying with the input signal between the channel and the substrate region. It can be proved (see, for example, Philips Research Reports, Feb. 1967, pp. 62–63, particularly formula 29) that in this case the steepness is independent of the resistivity of the substrate region so that the use of a comparatively low-ohmic material as stated above has no disadvantageous influence on the steepness in contrast with the case in which the channel is influenced only via the insulated gate electrode.

In order to prevent that for alternating signals the input impedance becomes too low it is desirable that the impedance between the source electrode and the substrate region should be higher than that between the substrate region and the insulated gate. electrode. An important preferred embodiment according to the invention is therefore characterized in that the decoupling capacity is larger than the capacity of the P-N junction between the source electrode and the substrate region. The decoupling capacity is advantageously chosen to be at least ten times as large as the capacity of the source electrode junction.

The decoupling capacity between the insulated gate electrode and the substrate region may be formed by a capacity or capacitor which is connected as an external circuit element to the gate electrode and the substrate region. The device according to the invention, however, is particularly suitable for construction in the form of an integrated circuit. According to an important preferred embodiment the insulated gate electrode is conductively connected to a metal layer situated outside the electrode regions on the insulating layer, which metal layer constitutes the said decoupling capacity with the insulating layer and the underlying substrate region.

According to another preferred embodiment the insulated gate electrode is conductively connected to a metal layer situated on the insulating layer, which metal layer adjoins, through an aperture in the insulating layer, a surface portion of the substrate region situated outside the electrode regions and with said portion forms a metal semiconductor junction, sometimes termed Schottky diode, the capacity of which constitutes the said decoupling capacity.

According to another very important preferred embodiment the insulated gate electrode is conductively connected to a metal layer situated partly on the insulating layer, which metal layer adjoins, through an aperture in the insulating layer, a surface region of the opposite conductivity type situated outside the electrode regions, which surface region constitutes a P-N junction with the underlying substrate region the capacity of which constitutes the said decoupling capacity. The doping and the thickness of said surface region is advantageously chosen to be substantially equal to that of the source and drain electrode regions, so that the surface region and the electrode regions can be manufactured simultaneously in the same operation.

The conductive connection between the insulated gate electrode and the decoupling capacity preferably comprises a metal track situated on the insulating layer. For this purpose, a readily conducting surface region of the opposite conductivity type situated in the substrate region may in circumstances be used advantageously, which surface region is insulated from the substrate region by a P-N junction, for example, in the case of the occurrence of intersections with other conductors. In the operating condition, said P-N junction should be biased in the reverse direction so as to avoid short circuit of the conductive connection with the substrate region.

The insulating layer preferably consists at least partly of silicon oxide which can be provided, for example, pyrolytically or by thermal oxidation. The semiconductor body in this case preferably consists of silicon.

If the underlying insulating layer is everywhere equal to the insulating layer below the gate electrode in construction and in electrical properties the metal track which connects the insulated gate electrode to the decoupling capacity will be able to induce an uninterrupted current channel so that the decoupling capacity on the side of the substrate region would be connected to the source electrode. An important preferred embodiment of the invention is therefore characterized in that the insulating layer between the metal track and the substrate region has, at least locally, other properties that between the gage electrode and the substrate region, to prevent the formation of an uninterrupted current channel below the metal track.

This difference in properties may relate both to the thickness of the insulating layer and to the material of which the insulating layer consists, or to the electric properties of said materials. Such as channel interrupting region can be provided in various manners, for example, by using a silicon oxide layer which locally has another composition, as is described in French Pat. specification No. 1,481,893.

According to an important preferred embodiment the insulating layer between the metal track and the substrate region at least locally has a greater thickness than between the gate electrode and the substrate region, so that there the field strength at the semiconductor surface is smaller, as a result of which the formation of an inversion channel up to a given maximum gate electrode potential can be avoided. The insulating layer may consist of silicon oxide or another material. When, according to another preferred embodiment, the insulating layer consists of silicon oxide, the oxide layer below the metal track adjoining the semiconductor surface is at least locally covered advantageously with a layer of silicon nitride, so as to prevent the formation of an uninterrupted current channel. As a result of this, channel formation is checked. See, for example, the prior Dutch Pat. application No. 6,715,753.

According to a further preferred embodiment, a channel-interrupting region is formed in that in the substrate region below the metal track a surface region of one conductivity type adjoining the insulating layer is locally provided and is doped more strongly than the substrate region, so that the formation of an inversion channel therein cannot occur.

In order that the invention may be readily carried into effect, a few examples thereof will now be described in greater detail, by way of example, with reference to the accompanying drawings, in which.

Figure 1:
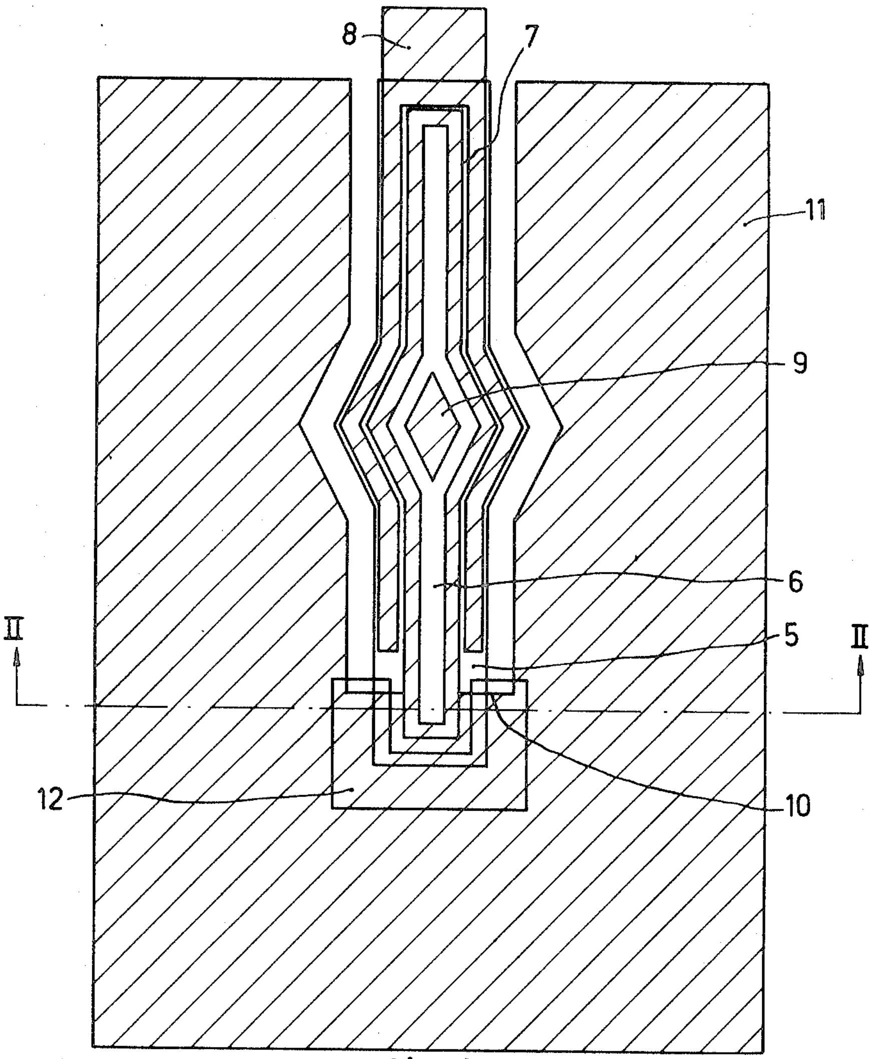
FIG. 1 is a diagrammatic plan view of a semiconductor device according to the invention.
Figure 2:
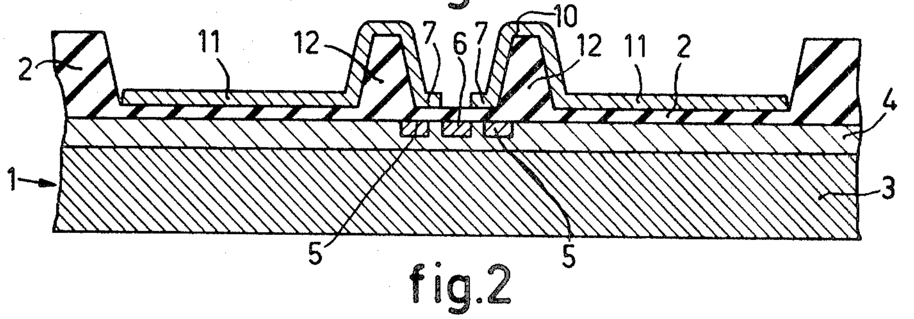
FIG. 2 is a diagrammatic cross-sectional view taken on the like II—II of the semiconductor device shown in FIG. 1.
Figure 3:
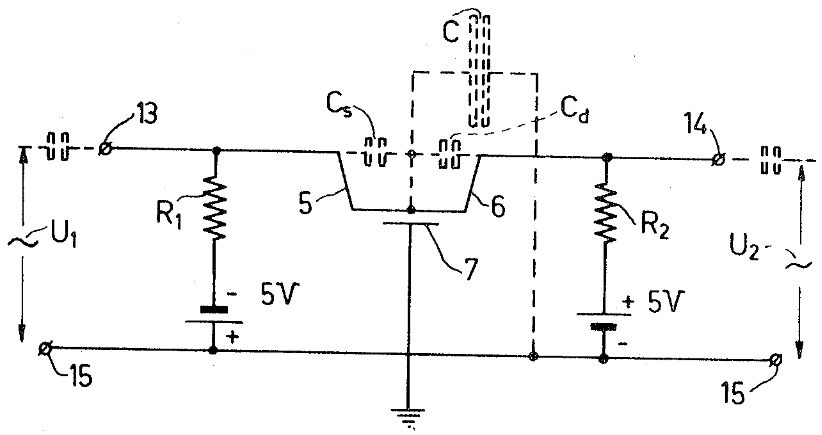

FIG. 3 diagrammatically shows a circuit arrangement in which the device shown in FIGS. 1 and 2 is operated in the enhancement mode.

Figure 4:
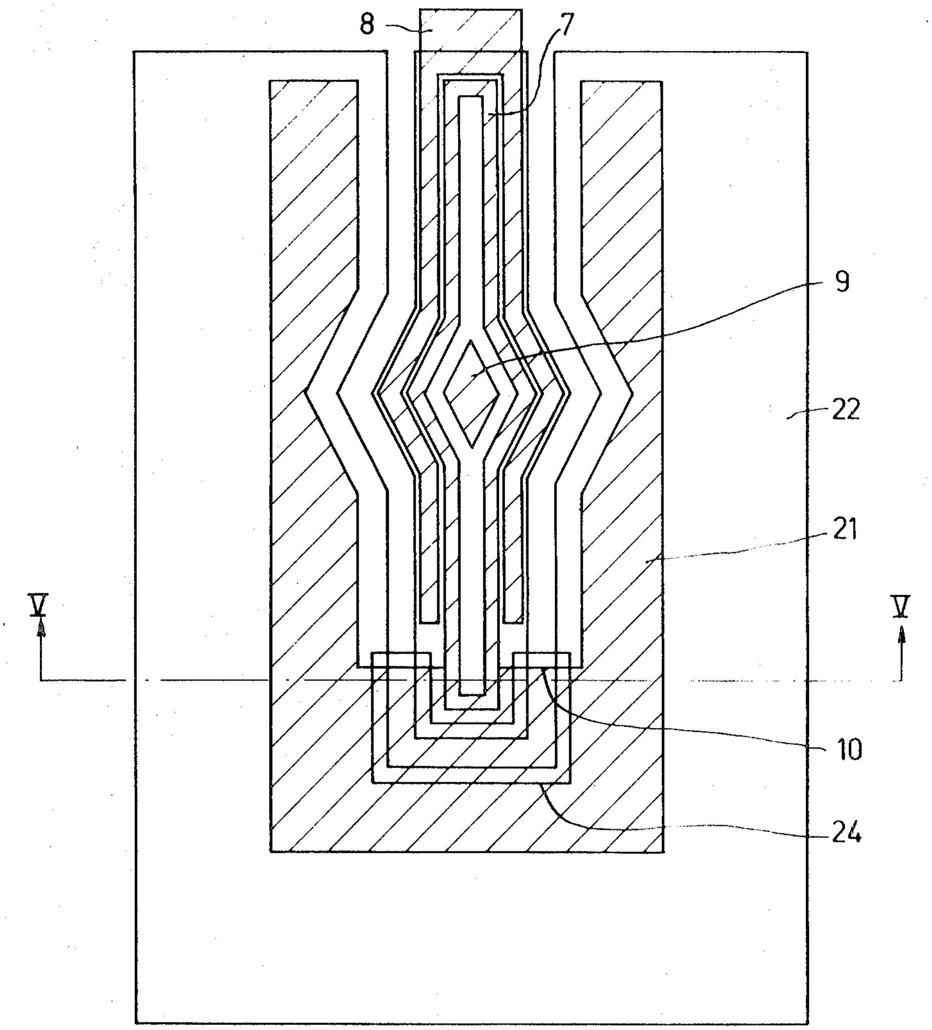

FIG. 4 is a diagrammatic plan view of another semiconductor device according to the invention.

Figure 5:
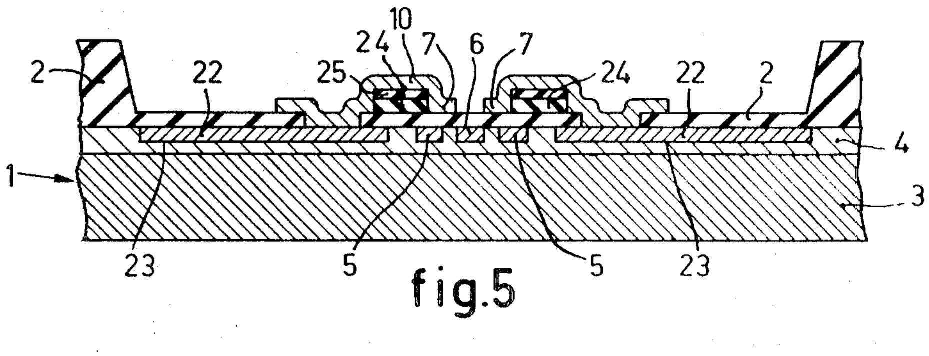

FIG. 5 is a diagrammatic cross-sectional view taken on line V—V of the semiconductor device shown in FIG. 4.

Figure 6:
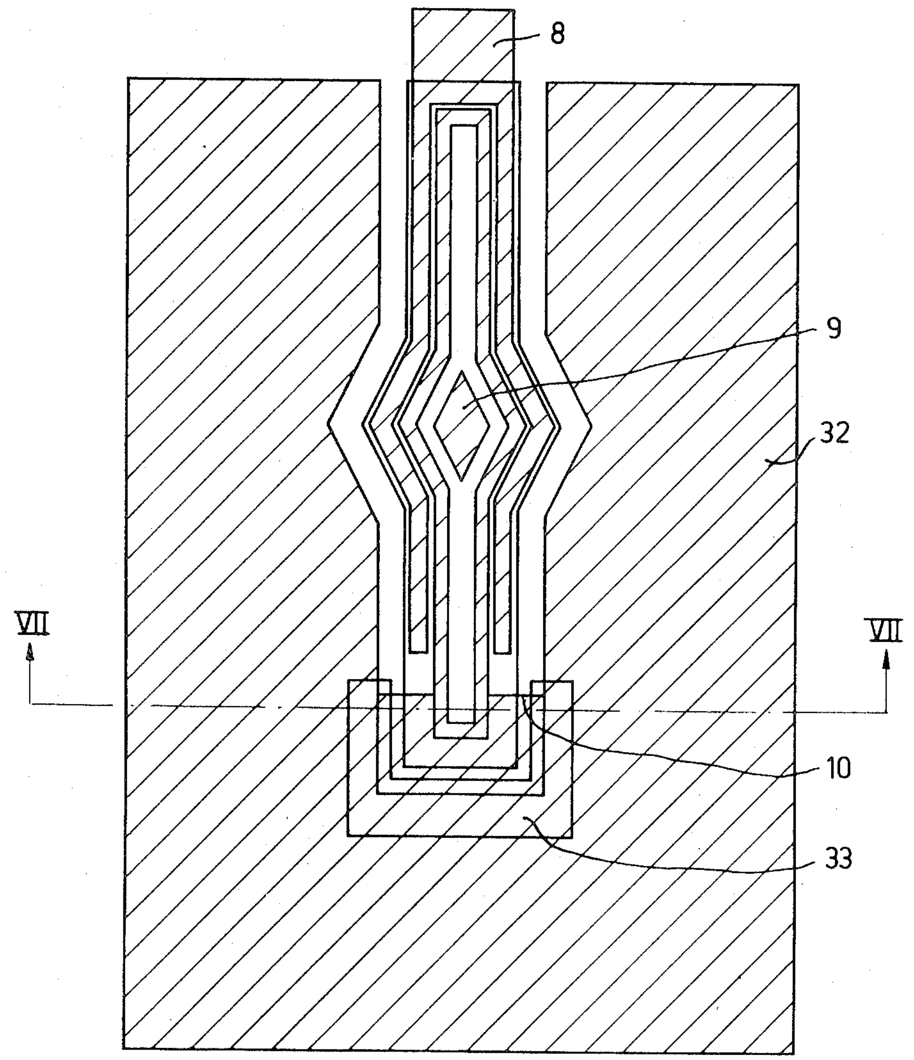
Figure 7:
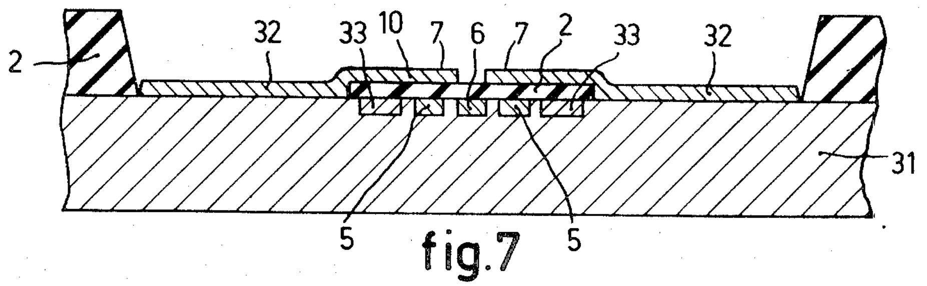

FIG. 6 is a diagrammatic plan view of a further semiconductor device according to the invention, and FIG. 7 is a diagrammatic cross-sectional view taken on line VII—VII of the semiconductor device shown in FIG. 6.

All the figures are diagrammatic and not drawn to scale for reasons of clarity. This holds in particular for the dimensions in the direction of thickness. In the plan views metal layers are shaded. Corresponding components in the Figures are referred to by the same reference numerals.

FIG. 1 is a plan view and FIG. 2 is diagrammatic cross-sectional view taken on the line II—II of a semiconductor device having a semiconductor body 1 of silicon which is covered with an insulating layer 2 of silicon oxide (see FIG. 2). The semiconductor body consists of a substrate 3 of P-type silicon having a resistivity of 0.01 Ohm.cm. on which an epitaxial layer 4 of P-type silicon having a resistivity of 3 ohm-cm. and a thickness of 6 $\mu$m. is provided which forms the substrate region of the field effect transistor having an insulated gate electrode. In the substrate region 4 diffused N-type electrode regions 5 and 6 are provided which adjoin the surface and the region 5 of which constitutes the source electrode region and the region 6 of which constitutes the drain electrode region of the field effect transistor (see FIGS. 1 and 2). Between the electrode regions 5 and 6 a gate electrode 7 in the form of an aluminum layer is provided on the oxide layer 2. The source electrode region 5 and the drain electrode region 6 are connected, through contact windows in the oxide layer (not shown in the FIGS.), to the aluminum layers 8 and 9 situated on the oxide layer (see FIG. 1).

The insulated gate electrode 7 according to the invention is capacitively connected to the substrate region 4 via a decoupling capacity which is larger than the capacity of the P-N junction between the drain electrode 6 and the substrate region. For that purpose the insulated gate electrode 7 in this example is conductively connected, via an aluminum layer 10 situated on the oxide layer, to an aluminum layer 11 situated on the oxide layer 2 outside the electrode regions, which layer 11 forms the said decoupling capacity with the oxide layer 2 and the underlying substrate region 4.

In this example the thickness of the oxide layer situated below the gate electrode 7 and below the aluminum layer 11 is approximately 0,1 $\mu$m. With this thickness of the dielectric the capacity between the aluminum layer 11 and the substrate region 4 is approximately 30,000 pF./sq.cm. It can furthermore be calculated that the capacity of an abrupt P-N junction between a strongly doped N-type region and the substrate region 4 (doping approximately $10^{16}$ acceptors/cc.) is likewise approximately 30,000 pF/sq.cm. in the absence of a bias voltage. The P-N junctions between the source and drain electrode and the substrate region constitute to an approximation such an abrupt P-N junction. In this example the surface area of the drain electrode is approximately 6,000 sq. $\mu$m. of the source electrode approximately 16,000 sq. $\mu$m. and of the decoupling capacity approximately 165,000 sq. $\mu$m. so that in accordance with the above the decoupling capacity is well over 25 times as large as the capacity between the drain electrode and the substrate region. This holds good to an even stronger extend in the operating condition, in which the drain electrode is biased in the reverse direction with respect to the substrate region, so that the relative drain electrode capacity is reduced. In accordance with the above, the decoupling capacity also is more than 10 times larger than the capacity of the P-N junction between the source electrode and the substrate region.

In order to prevent the formation of an uninterrupted current channel below the aluminum layer 10 (see FIG. 1 and 2) the part 12 of the oxide layer between the layer 10 and the substrate region 4 has a greater thickness (thickness approximately 0.6 $\mu$m.) than between the gate electrode 7 and the substrate region. At the voltages normally occuring between the gate electrode and the substrate region, the formation of an inversion channel below the layer 10, as a result of which undesired short circuit between the drain electrode and the decoupling capacity occurs, is avoided at least up to a given gate electrode potential.

The source electrode 5, the drain electrode 6 and the gate electrode 7 are connected, via connection conductors (with which are partly associated also the already mentioned aluminum layers), to the connection terminals between 13, 14, and 15). See FIG. 3, in which a circuit arrangement comprising the device shown in FIGS. 1 and 2 is diagrammatically shown. In this example the terminal 15 connected to the gate electrode, which is connected to ground, is common for the input circuit and the output circuit, while a signal $U_1$ to be amplified is capacitively applied to the source electrode via the terminal 13 and an amplified signal $U_2$ is capacitively derived from the drain electrode via terminal 14.

In the circuit arrangement shown in FIG. 3, a negative voltage of 5 volt with respect to the gate electrode 7 is set up at the source electrode 5, via a resistor $R_1$, while a positive voltage of 5 volt with respect to the gate electrode 7 is set up at the drain electrode 6, via the resistor $R_2$. In these circumstances the field effect transistor is operated in the enhancement mode, the concentration of electrons at the surface of the substrate region between the source and drain electrode being increased and an N-type inversion channel being formed the cross section of which and hence the resistance is influenced by the input signal $U_1$.

As a result of the presence of the decoupling capacity, said current channel, as already noted above, is also influenced for alternating signals by the substrate region 4 serving as a second gate electrode, so that the steepness is increased. The decoupling capacity C, as well as the capacities of the source electrode ($C_s$) and the drain electrode (Cd) with respect to the substrate region are shown in broken lines in FIG. 3.

The semiconductor device described in this example can be manufactured by means of methods which are conventional in semiconductor technology. Starting material is the substrate 3 on which by epitaxial growing by decomposition of, for example, $SiCl_4$ while adding a volatile boron compound, for example, $BH_3$, the layer 4 is provided having a thickness of 6 $\mu$m. and a resistivity of 3 ohm-cm. By thermal oxidation in moist oxygen at approximately 1,200° C., an oxide layer is then provided having a thickness of 0.6 $\mu$m., in which windows are etched by means of known and universally used photoresist methods. By selective diffusion of phosphorus the electrode region 5 and 6 are provided via said windows, with a depth of penetration of approximately 2 $\mu$m. Then, likewise by a photoresist method, the oxide layer is removed at the area of the gate electrode 7 to be provided and of the aluminum layer 11 to be provided (in which inter alia the region 12 is maintained) after which by oxidation in moist oxygen at 1,100° a thinner, 0.1 $\mu$m. thick, oxide layer is provided at these places. In the oxide layer the necessary contact windows are then etched, after which by vapor deposition combined with a further photomasking the metal layers 7, 8, 9, 10 and 11 are provided, on which for example, by thermobonding, the connection conductors are secured. In the manner described, a large number of field effect transistors can be provided on one single silicon wafer, if required combined to an integrated circuit together with other elements. These units are then separated and each provided in a suitable envelope.

FIG. 4 is a plan view and FIG. 5 a cross-sectional view taken on the line V—V of FIG. 4 of another example of the device according to the invention. In this device, the decoupling capacity is constituted by a diffused region. For that purpose (FIGS. 4 and 5) the insulated gate electrode 7 is conductively connected, by means of an aluminum layer 10, with an aluminum layer 21 situated partly on the oxide layer 2 and adjoining, through a contact window in the oxide layer, a surface region 22 which is of the N-type and is situated outside the electrode regions, and which constitutes a P-N junction 23 with the underlying substrate region 4 (see FIG. 5). The capacity of this P-N junction 23 constitutes the said decoupling capacity. The surface region 22 was diffused simultaneously with the source and drain electrode regions 5 and 6, and therefore has substantially the same doping and thickness as the regions 5 and 6.

In order to prevent the formation of an uninterrupted current channel below the metal layer 10, the oxide layer 2 in this example is locally covered with a layer of silicon nitride, thickness 0.2 $\mu$m. As a result of this the formation an inversion channel between the regions 5 and 23 is checked (see the above Dutch Pat. application No. 6,715,753). The nitride layer 24 may be provided by decomposition of silicon hydride and hydrazine, after which on said nitride layer a silicon oxide layer 25 is pyrolytically provided. This pyrolytically provided oxide layer 25 (provided, for example, by sputtering) is removed outside the region 24, by a photomasking method and the parts of the nitride layer not covered with oxide are then removed by etching with phosphoric acid, by which the oxide layer is attached only slightly. For this etching method see, for example, W. V. Gelder, "Journal of the Electrochemical Society", Aug. 1967, "The Etching of Silicon Nitride in Phosphoric Acid with Silicon Dioxide as a mask", and the Dutch Pat. application No. 6,704,958 laid open to public inspection.

For the rest, the construction of this device is quite similar to that of the device shown in FIGS. 1 and 2, so that in this case also the remarks made in the preceding example regarding the relative values of the decoupling capacity with respect to the capacities between the source and drain electrodes and the substrate region hold good. The device may furthermore be manufactured in the same manner and be incorporated in a circuit arrangement as described in the first example.

FIG. 6 is a plan view and FIG. 7 is a cross-sectional view taken on the line VII—VII of FIG. 6 of a third example of a semiconductor device according to the invention. This device consists of a semiconductor body 31 of N-type silicon having a resistivity of 0.8 ohm-cm. which constitutes the substrate region and in which the selective diffusion of boron a P-type source electrode region 5 and a P-type drain electrode region 6 are provided with a depth of penetration of 2 $\mu$m. In this example the decoupling capacity is constituted by a Schottky diode. For that purpose the insulated gate electrode 7 is conductively connected via the metal layer 10 to a nickel layer 32 situated on the oxide layer, which nickel layer adjoins, via an aperture in the oxide layer 2, a surface part of the N-type substrate region 31 situated outside the electrode regions and forms a Schottky barrier therewith the capacity of which constitutes the decoupling capacity. Such a metal semiconduction which forms a Schottky diode is to be considered as an abrupt P-N junction and therefore has substantially the same capacity per surface unit as the P-N junction between the electrode regions 5 and 6 and the substrate region 31 which are constituted by diffusions of high surface concentration and comparatively low depth of penetration. The dimensions of this device are the same as those of the device described above, so that in this case also the same relative values of the decoupling capacity with respect to the source and drain electrode capacity hold good. The formation of an inversion channel at the surface between the source electrode and the decoupling capacity is prevented in this example in that in the substrate region 31 below the metal layer 10 a surface region 33 which adjoins the oxide layer 2 is locally provided and the doping of which is so much stronger than the substrate region 31 that no inversion channel in this region can be formed. For the rest this device is analogous in construction to the above-described devices and can be manufactured while using the same method. The metal layers 7, 10 and 23 are preferably manufactured from the same material and this also applies to the layers 8 and 9, as a result of which all these metal layers can be provided simultaneously in the same vapor deposition process and photomasking step. For the formation of a Schottky barrier on N-type silicon, materials other than nickel, for example, gold, may be used. The device may furthermore be incorporated, in a manner analogous to that described in the first example, in a circuit arrangement in which in this case, of course, the polarity of the applied direct voltage must be reversed.

It will be obvious that the invention is not restricted to the examples described but that many variations are possible to those skilled in the art without departing from the scope of this invention. For example, the decoupling capacity may also be incorporated in the circuit arrangement as an external circuit element. Moreover, instead of silicon other semiconductor materials may be used, while the insulating materials may also consist of materials other than silicon oxide, for example, of other oxides or of silicon nitride. The geometry of the contacts may furthermore be varied within wide limits while observing the requirements imposed upon the capacity values according to the invention. The device according to the invention may in circumstances also be used in circuit arrangements other than those in the examples described, for example, in circuit arrangements in which the field effect transistor is operated in the depletion mode.

I claim:

1. A semiconductor device comprising a semiconductor body having a surface covered at least partly by an insulating layer and including an insulated gate field effect transistor, said transistor comprising a substrate region of the body of one conductivity type having spaced source and drain electrode regions of the opposite conductivity type adjoining its surface under the insulating layer, a gate electrode on the insulating layer and having a portion extending over the substrate region between the source and drain electrodes, and means providing a decoupling capacitor capacitively coupling the gate electrode to the substrate region, said decoupling capacitor having a capacitance substantially larger than the capacitance of the P-N junction between the drain electrode region and the substrate region.

2. A semiconductor device as claimed in claim 1 wherein the said decoupling capacitance is at least ten times larger than the capacitance of the P-N junction between the drain electrode region and the substrate region.

3. A semiconductor device as claimed in claim 1 wherein the said decoupling capacitance is larger than the capacitance of the P-N junction between the source electrode region and the substrate region.

4. A semiconductor device as claimed in claim 3 wherein the decoupling capacitance is at least ten times larger than the capacitance of the P-N junction between the source electrode region and the substrate region.

5. A semiconductor device as claim in claim 1 wherein the semiconductor body consists of semiconductor material of one conductivity type having a resistivity of at most 1 Ohm.cm. in which the electrode regions are provided.

6. A semiconductor device as claimed in claim 1 wherein the semiconductor body comprises a substrate of one conductivity type on which an epitaxial layer of one conductivity type having a higher resistivity than the substrate is provided and which constitutes the substrate region.

7. A semiconductor device as claimed in claim 6 wherein the substrate has a resistivity of at most 0.1 ohm-cm. and the epitaxial layer has a resistivity which lies between approximately 0.5 ohm-cm. and approximately 5 ohm-cm.

8. A semiconductor device as claimed in claim 1 wherein the insulated gate electrode is conductively connected to a metal layer situated outside the electrode regions and on the insulating layer, said metal layer constituting the said decoupling capacitor with the insulating layer and the underlying substrate region.

9. A semiconductor device as claimed in claim 1 wherein the insulated gate electrode is conductively connected to a metal layer situated on the insulating layer, which metal layer adjoins through an aperture in the insulating layer a surface portion of the substrate region situated outside the electrode regions and forms a Schottky diode with it constituting the said decoupling capacitor.

10. A semiconductor device as claimed in claim 1 wherein the insulated gate electrode is conductively connected to a metal layer which is partly situated on the insulating layer, which metal layer adjoins through an aperture in the insulating layer a surface region of the opposite conductivity type situated outside the electrode regions and forming a P-N junction with the underlying substrate region constituting the said decoupling capacitor.

11. A semiconductor device as claimed in claim 10 wherein the said surface region of the opposite conductivity type has substantially the same thickness and doping as the electrode regions.

12. A semiconductor device as set forth in claim 1 wherein the decoupling capacitor comprises a region of the body and a metal track on the insulating layer is provided connecting the decoupling capacitor to the gate electrode.

13. A semiconductor device as claimed in claim 12 wherein the insulating layer portion between the metal track and the substrate region has, at least locally, other properties than that of the portion between the gate electrode and the substrate region to prevent the formation of an uninterrupted current channel below the metal track.

14. A semiconductor device as claimed in claim 13 wherein the insulating layer portion between the metal track and the substrate region has, at least locally, a greater thickness than that of the portion between the gate electrode and the substrate region.

15. A semiconductor device as claimed in claim 13 wherein the insulating layer adjoining the semiconductor surface below the metal track comprises, at least locally a layer of silicon nitride.

16. A circuit arrangement for amplifying electric signals comprising a semiconductor device as claimed in claim 1 wherein means are provided comprising input and output circuits and connecting the insulated gate electrode common to the input circuit and the output circuit, and means are provided coupling the input circuit to the source electrode and the output circuit to the drain electrode.

17. A circuit arrangement as claimed in claim 16 wherein the field effect transistor is operated in the enchancement mode in that a voltage is applied to the source and drain electrode with respect to the gate electrode so that the substrate region below the gate electrode is enchanced with opposite conductivity type charge carriers.

PO-1050
(5/69)

UNITED STATES PATENT OFFICE

CERTIFICATE OF CORRECTION

Patent No. 3621347 Dated November 16, 1971

Inventor(s) JOHANNES ARIE VAN NIELEN

It is certified that error appears in the above-identified patent and that said Letters Patent are hereby corrected as shown below:

Col. 1, line 74, "surface" should read -- substrate --;

Col. 3, line 43, "that" should read -- than --;

line 44, "gage" should read -- gate --;

Col. 4, line 8, "like" should read -- line --;

line 58, "0,1μm." should read -- 0.1μm. --;

line 63, "cc." should read --ccm. --;

Col. 6, line 31, "attached" should read -- attacked --.

Signed and sealed this 23rd day of May 1972.

(SEAL)
Attest:

EDWARD M.FLETCHER,JR.
Attesting Officer

ROBERT GOTTSCHALK
Commissioner of Patents